US012588232B2

(12) United States Patent
Harada et al.

(10) Patent No.: US 12,588,232 B2
(45) Date of Patent: Mar. 24, 2026

(54) SEMICONDUCTOR-ELEMENT-INCLUDING MEMORY DEVICE

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 538 days.

(21) Appl. No.: 17/742,978

(22) Filed: May 12, 2022

(65) Prior Publication Data

US 2022/0367681 A1      Nov. 17, 2022

(30) Foreign Application Priority Data

May 14, 2021      (WO) .................. PCT/JP2021/018427

(51) Int. Cl.
*H10D 30/63*          (2025.01)
*H10D 30/01*          (2025.01)
(Continued)

(52) U.S. Cl.
CPC ........... *H10D 30/025* (2025.01); *H10D 30/63* (2025.01); *H10D 30/6728* (2025.01);
(Continued)

(58) Field of Classification Search
CPC ....... H01L 29/66666; H01L 21/823885; H01L 27/1203; H01L 29/78642; H01L 29/7827;
(Continued)

(56) References Cited

U.S. PATENT DOCUMENTS

2003/0111681 A1      6/2003    Kawanaka
2006/0049444 A1      3/2006    Shino
(Continued)

FOREIGN PATENT DOCUMENTS

JP      H 02-188966 A      7/1990
JP      H 03-171768 A      7/1991
(Continued)

OTHER PUBLICATIONS

Morishita, Hideyuki Noda, Isamu Hayashi, Takayuki Gyohten, Mako Okamoto, Takashi Ipposhi, Shigeto Maegawa, Katsumi Dosaka, Kazutami Arimoto, "A Capacitorless Twin-Transistor Random Access Memory (TTRAM) on SOI" in IEICE Transactions on Electronics, vol. E90-C, No. 4, pp. 765-771, Apr. 2007 (Year: 2007).*
(Continued)

*Primary Examiner* — Matthew C Landau
*Assistant Examiner* — David W Ward
(74) *Attorney, Agent, or Firm* — Crowell & Moring LLP

(57)          ABSTRACT

A dynamic flash memory cell includes an Si base material formed of a first channel region and a second channel region. In the Si base material, a first gate insulating layer surrounds the first channel region, and a second gate insulating layer surrounds the second channel region. A first gate conductor layer surrounds the first gate insulating layer, and a second gate conductor layer surrounds the second gate insulating layer. The first gate conductor layer is connected to a plate line PL, and the second gate conductor layer is connected to a word line WL. An N+ layers formed, respectively, on one ends of the Si base materials are connected to a source line, and an N+ layers formed, respectively, on the other ends of the Si base materials are connected to a bit line BL.

11 Claims, 11 Drawing Sheets

(51) Int. Cl.

| | | |
|---|---|---|
| *H10D 30/67* | (2025.01) | |
| *H10D 84/01* | (2025.01) | |
| *H10D 84/03* | (2025.01) | |
| *H10D 86/00* | (2025.01) | |

(52) U.S. Cl.
CPC ....... *H10D 84/0195* (2025.01); *H10D 84/038* (2025.01); *H10D 86/201* (2025.01)

(58) Field of Classification Search
CPC .. H10D 30/025; H10D 30/63; H10D 30/6728; H10D 30/6704; H10D 30/674; H10D 84/0195; H10D 84/038; H10D 84/01; H10D 86/201; H10D 30/0318
See application file for complete search history.

(56) References Cited

U.S. PATENT DOCUMENTS

| | | | | |
|---|---|---|---|---|
| 2008/0137394 | A1 | 6/2008 | Shimano | |
| 2008/0212366 | A1 | 9/2008 | Ohsawa | |
| 2008/0251825 | A1* | 10/2008 | Lee | H10D 30/63 |
| | | | | 257/E29.264 |
| 2011/0121396 | A1* | 5/2011 | Lee | G11C 11/403 |
| | | | | 257/E29.264 |
| 2014/0138756 | A1* | 5/2014 | Son | H10B 41/23 |
| | | | | 257/315 |
| 2017/0309632 | A1* | 10/2017 | Masuoka | H01L 21/823814 |
| 2018/0151672 | A1* | 5/2018 | Choi | H10B 41/27 |
| 2019/0074250 | A1* | 3/2019 | Chen | B82Y 10/00 |
| 2022/0130856 | A1* | 4/2022 | Kim | G11C 7/18 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/018247 dated Jul. 6, 2021, 3 pgs.

English translation of International Search of Search Report (PCT/ISA/210) of PCT/JP2021/018247, 2 pgs.

Written Opinion (PCT/ISA/237) (Japanese) of PCT/JP2021/018247 dated Jul. 6, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief description attached.

* cited by examiner

CELL CURRENT
Icell (BL to SL Current)

"1" WRITE STATE

"0" ERASE STATE

WORD LINE VOLTAGE $V_{WL}$

FIG. 2A "1" WRITE STATE $V_{FB} = Vb$

FIG. 2B "0" ERASE OPERATION $V_{FB} = V_{ERA} + Vb$ $V_{SL} = V_{ERA}$

Vb: Built-in Voltage 0.7V
BUILT-IN VOLTAGE 0.7V

FIG. 3A "1" WRITE OPERATION
SOURCE-SIDE IMPACT IONIZATION

FIG. 3B "1" WRITE STATE

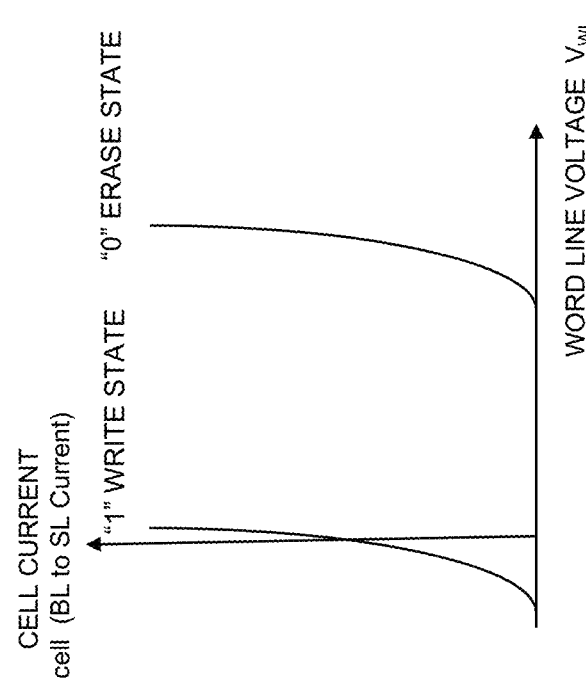
FIG. 4AC
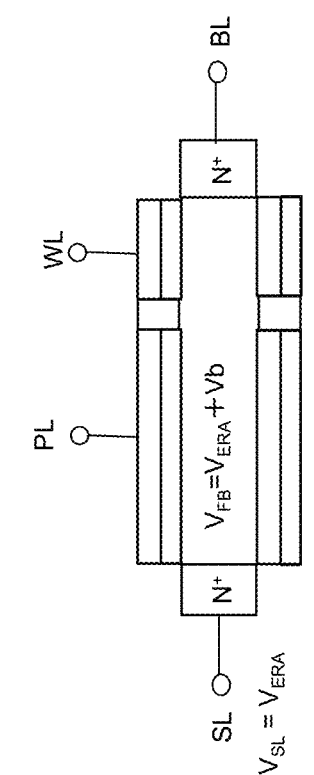
FIG. 4AA  "1" WRITE STATE
FIG. 4AB  "0" ERASE STATE

BL: BIT LINE
SL: SOURCE LINE
WL: WORD LINE
PL: PLATE LINE
FB: FLOATING BODY $$C_{FB} = C_{PL} + C_{WL} + C_{BL} + C_{SL}$$

$$\Delta V_{FB} = V_{FB2} - V_{FB1}$$

$$= \frac{C_{WL}}{C_{PL} + C_{WL} + C_{BL} + C_{SL}} \times V_{ReadWL} \qquad (1)$$

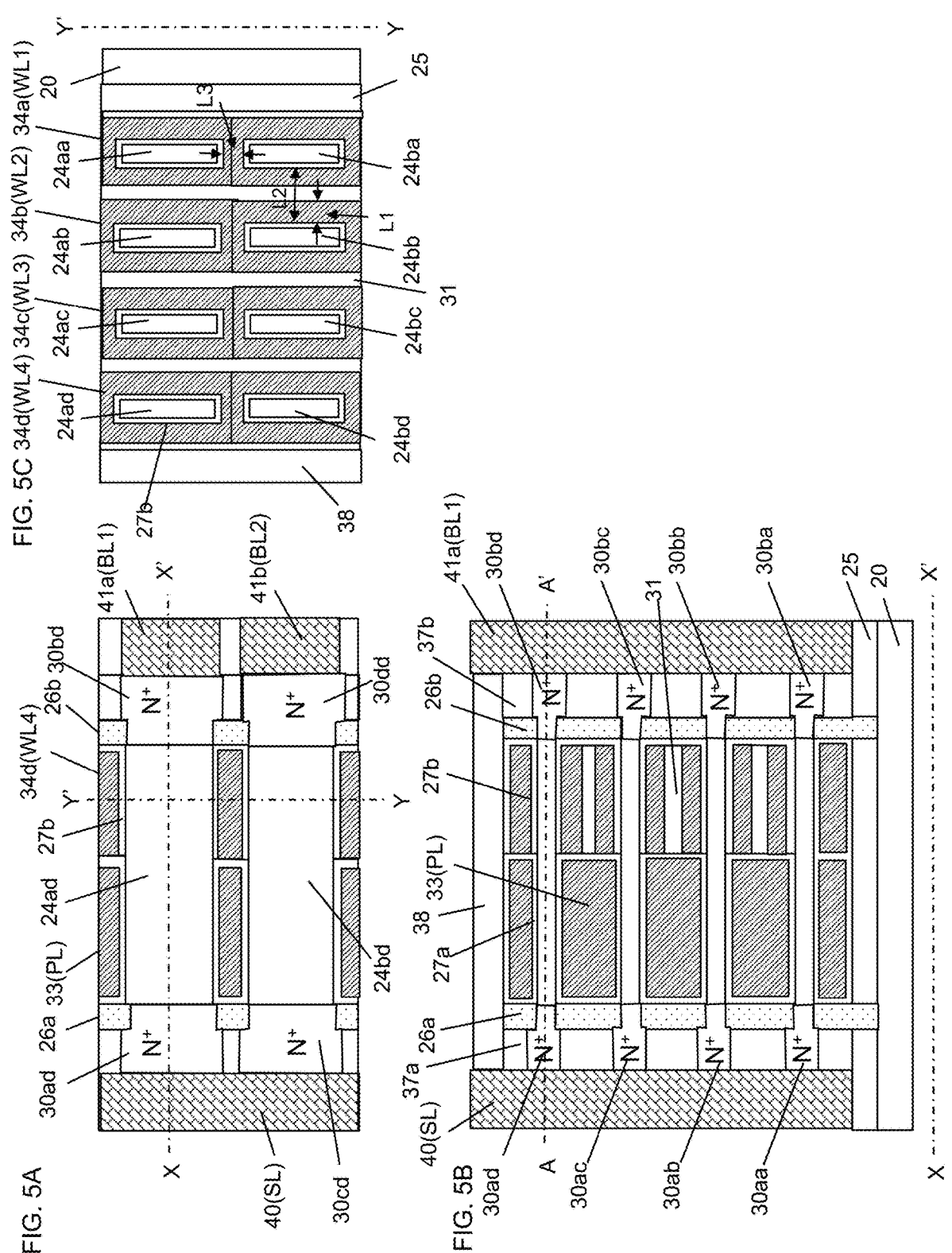

CELL CURRENT
Icell (BL to SL Current)

WORD LINE VOLTAGE WL

FIG. 9A
Prior Art
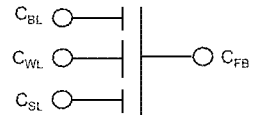
$$C_{FB} = C_{WL} + C_{BL} + C_{SL} \quad \text{EXPRESSION (2)}$$
FIG. 9B
Prior Art
$$\Delta V_{FB} = V_{FB2} - V_{FB1}$$
$$= \frac{C_{WL}}{C_{WL} + C_{BL} + C_{SL}} \times V_{ProgWL} \quad \text{EXPRESSION (3)}$$
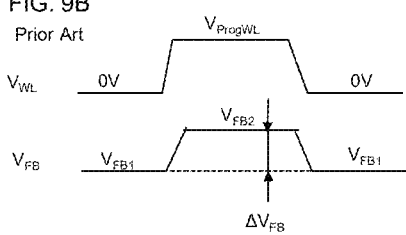
$$\beta = \frac{C_{WL}}{C_{WL} + C_{BL} + C_{SL}} \quad \text{EXPRESSION (4)}$$

105

WL(+)

110

103

SL(0V)

BL(+)

106

109

104

N

N

100

102

SiO₂

101

P

105

WL(+)

110

103

SL(0V)

BL(-)

109

104

N

N

100

102

101

CELL CURRENT
Icell (BL to SL Current)

"1"

"0"

WL

SEMICONDUCTOR-ELEMENT-INCLUDING MEMORY DEVICE

CROSS-REFERENCE TO RELATED APPLICATIONS

This application claims priority to PCT/JP2021/018427 filed May 14, 2021, the enter content of which is incorporated herein by reference.

TECHNICAL FIELD

The present invention relates to a semiconductor-element-including memory device.

BACKGROUND ART

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, PTL 1 and NPL 1). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), and an MRAM (Magneto-resistive Random Access Memory, see, for example, NPL 5) that changes the resistance by changing the orientation of a magnetic spin with a current. Further, there exists, for example, a DRAM memory cell (see, for example, NPL 6) constituted by a single MOS transistor and including no capacitor. The present application relates to a dynamic flash memory that can be constituted only by a MOS transistor and that includes no resistance change element or capacitor.

FIGS. 8A to 8D illustrate a write operation of a DRAM memory cell constituted by a single MOS transistor and including no capacitor described above, FIGS. 9A and 9B illustrate a problem in the operation, and FIGS. 10A to 10C illustrate a read operation (see NPL 7).

FIGS. 8A to 8D illustrate a write operation of a DRAM memory cell. FIG. 8A illustrates a "1" write state. Here, the memory cell is formed on an SOI substrate 100, is constituted by a source $N^+$ layer 103 (hereinafter, a semiconductor region that contains a donor impurity in high concentrations is referred to as "$N^+$ layer") to which a source line SL is connected, a drain $N^+$ layer 104 to which a bit line BL is connected, a gate conductor layer 105 to which a word line WL is connected, and a floating body 102 of a MOS transistor 110a, and includes no capacitor. The single MOS transistor 110a constitutes the DRAM memory cell. Directly under the floating body 102, a $SiO_2$ layer 101 of the SOI substrate is in contact with the floating body 102. To write "1" to the memory cell constituted by the single MOS transistor 110a, the MOS transistor 110a is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both the bit line BL connected to the drain $N^+$ layer 104 and the word line WL connected to the gate conductor layer 105, and the MOS transistor 110a is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. Simultaneously, positive holes 106 are generated with which the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P layer, namely, the floating body 102, and is equal to about 0.7 V. FIG. 8B illustrates a state in which the floating body 102 is charged to saturation with the generated positive holes 106.

Now, a "0" write operation of a memory cell 110b will be described with reference to FIG. 8C. For the common selection word line WL, the memory cell 110a to which "1" is written and the memory cell 110b to which "0" is written are present at random. FIG. 8C illustrates a state of rewriting from the "1" write state to a "0" write state. To write "0", the voltage of the bit line BL is set to a negative bias, and the PN junction between the drain $N^+$ layer 104 and the P layer, namely, the floating body 102, is forward biased. As a result, the positive holes 106 in the floating body 102 generated in advance in the previous cycle flow into the drain $N^+$ layer 104 that is connected to the bit line BL. When the write operation ends, the two memory cells are in a state in which the memory cell 110a (FIG. 8B) is filled with the generated positive holes 106, and from the memory cell 110b (FIG. 8C), the generated positive holes are discharged. The potential of the floating body 102 of the memory cell 110a filled with the positive holes 106 becomes higher than that of the floating body 102 in which generated positive holes are not present. Therefore, the threshold voltage for the memory cell 110a becomes lower than the threshold voltage for the memory cell 110b. This is illustrated in FIG. 8D.

Now, a problem in the operation of the memory cell constituted by the single MOS transistor will be described with reference to FIGS. 9A and 9B. As illustrated in FIG. 9A, the capacitance $C_{FB}$ of the floating body 102 is equal to the sum of the capacitance $C_{WL}$ between the gate to which the word line is connected and the floating body 102, the junction capacitance $C_{SL}$ of the PN junction between the source $N^+$ layer 103 to which the source line is connected and the floating body 102, and the junction capacitance $C_{BL}$ of the PN junction between the drain $N^+$ layer 104 to which the bit line is connected and the floating body 102 and is expressed as follows.

$$C_{FB}=C_{WL}+C_{BL}+C_{SL} \qquad (2)$$

Therefore, a change in the word line voltage $V_{WL}$ at the time of writing affects the voltage of the floating body 102 that functions as a storage node (contact point) of the memory cell. This is illustrated in FIG. 9B. When the word line voltage $V_{WL}$ rises from 0 V to $V_{ProgWL}$ at the time of writing, the voltage VFB of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB}=V_{FB2}-V_{FB1}=C_{WL}/(C_{WL}+C_{BL}+C_{SL})\times V_{ProgWL} \quad (3)$$

Here, $C_{WL}/(C_{WL}+C_{BL}+C_{SL})$ is expressed as follows.

$$\beta=C_{WL}/(C_{WL}+C_{BL}+C_{SL}) \quad (4)$$

$\beta$ is called a coupling ratio. In this memory cell, the contribution ratio of $C_{WL}$ is large and, for example, $C_{WL}:C_{BL}:C_{SL}=8:1:1$ holds. This results in $\beta=0.8$. When the word line changes, for example, from 5 V at the time of writing to 0 V after the end of writing, the floating body 102 receives an amplitude noise of 5 V$\times\beta=4$ V due to capacitive coupling between the word line and the floating body 102. Accordingly, a sufficient margin is not provided to the potential difference between the "1" potential and the "0" potential of the floating body at the time of writing, which is a problem.

FIGS. 10A to 10C illustrate a read operation. FIG. 10A illustrates a "1" write state and FIG. 10B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 10C. This small operation margin has been a major problem of this DRAM memory cell. In addition, a high density needs to be attained in the DRAM memory cell.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)
[NPL 7] E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006.

SUMMARY OF INVENTION

Technical Problem

In capacitor-less single-transistor DRAMs (gain cells) in an SGT-including memory device, capacitive coupling between the word line and the SGT body in a floating state is strong. When the potential of the word line is changed at the time of data reading or at the time of data writing, the change is transmitted as direct noise to the SGT body, which has been a problem. This causes a problem of erroneous reading or erroneous rewriting of storage data and makes it difficult to commercially introduce capacitor-less single-transistor DRAMs (gain cells). The above-described problems need to be solved, and further, high-performance and high-density DRAM memory cells need to be attained.

Solution to Problem

To solve the above-described problems, a memory device according to the present invention includes:

a first semiconductor base material that extends parallel to and in a horizontal direction relative to a substrate;

a second semiconductor base material that is apart from the first semiconductor base material in a vertical direction and that overlaps the first semiconductor base material in plan view;

a first impurity layer that is connected to one end of the first semiconductor base material and a second impurity layer that is connected to the other end of the first semiconductor base material;

a third impurity layer that is connected to one end of the second semiconductor base material and a fourth impurity layer that is connected to the other end of the second semiconductor base material;

a first gate insulating layer that covers a first region of the first semiconductor base material connected to the first impurity layer and a first region of the second semiconductor base material connected to the third impurity layer;

a second gate insulating layer that is connected to the first gate insulating layer and that covers a second region of the first semiconductor base material and a second region of the second semiconductor base material;

a first gate conductor layer that surrounds the first gate insulating layer and that is formed of portions isolated from each other so as to correspond to the first semiconductor base material and the second semiconductor base material or functioning as a common gate of the first semiconductor base material and the second semiconductor base material;

a second gate conductor layer that surrounds the second gate insulating layer surrounding the second region of the first semiconductor base material; and a third gate conductor layer that surrounds the second gate insulating layer surrounding the second region of the second semiconductor base material and that is electrically apart from the second gate conductor layer, in which voltages applied to the first impurity layer, the second impurity layer, the third impurity layer, the fourth impurity layer, the first gate conductor layer, the second gate conductor layer, and the third gate conductor layer are controlled to perform a memory write operation, a memory read operation, and a memory erase operation (first invention).

In the first invention described above, the first impurity layer and the third impurity layer are connected to a first wiring conductor layer that is connected to a first source line shared or isolated into two portions, and the second impurity layer and the fourth impurity layer are connected to a second wiring conductor layer that is connected to a first bit line shared or isolated into two portions (second invention).

In the first invention described above, the second impurity layer and the fourth impurity layer are connected to a second wiring conductor layer that is connected to a first bit line, and the second gate conductor layer and the third gate conductor layer are isolated from each other (third invention).

In the first invention described above, the second gate conductor layer and the third gate conductor layer are connected to each other, and the second impurity layer and the fourth impurity layer are connected to first bit lines isolated from each other (fourth invention).

In the first invention described above, the memory write operation is performed in which, of a group of electrons and a group of positive holes generated by an impact ionization phenomenon caused by a current that is provided into the first semiconductor base material and into the second semiconductor base material or by a gate-induced drain leakage current, the group of electrons or the group of positive holes that are minority carriers in the first semiconductor base material and in the second semiconductor base material are discharged from either the first semiconductor base material or the second semiconductor base material or both the first semiconductor base material and the second semiconductor base material and in which some or all of the group of positive holes or the group of electrons that are majority carriers in the first semiconductor base material and in the second semiconductor base material are kept remaining in the first semiconductor base material and in the second semiconductor base material, and the memory erase operation is performed in which, of the group of positive holes and the group of electrons that are majority carriers, the group of positive holes or the group of electrons that remain are discharged from either the first semiconductor base material or the second semiconductor base material or both the first semiconductor base material and the second semiconductor base material (fifth invention).

In the first invention described above, the third gate conductor layer is connected to a word line, and the first gate conductor layer and the second gate conductor layer are connected to plate lines (sixth invention).

In the first invention described above, a first dynamic flash memory is constituted by and includes:

a third semiconductor base material that is at a height the same as a height at which the first semiconductor base material is disposed in the vertical direction and that extends parallel to the first semiconductor base material;

a fourth semiconductor base material that is at a height the same as a height at which the second semiconductor base material is disposed in the vertical direction and that extends parallel to the second semiconductor base material;

a fifth impurity layer that is connected to one end of the third semiconductor base material and a sixth impurity layer that is connected to the other end of the third semiconductor base material;

a seventh impurity layer that is connected to one end of the fourth semiconductor base material and an eighth impurity layer that is connected to the other end of the fourth semiconductor base material;

the first gate insulating layer that covers a first region of the third semiconductor base material connected to the fifth impurity layer and a first region of the fourth semiconductor base material connected to the seventh impurity layer;

the second gate insulating layer that is connected to the first gate insulating layer and that covers a second region of the third semiconductor base material and a second region of the fourth semiconductor base material;

the first gate conductor layer that surrounds the first gate insulating layer and that functions as a common gate of the first semiconductor base material, the second semiconductor base material, the third semiconductor base material, and the fourth semiconductor base material;

the second gate conductor layer that surrounds the second gate insulating layer surrounding the second region of the third semiconductor base material and that functions as a common gate of the first semiconductor base material and the third semiconductor base material; and the third gate conductor layer that surrounds the second gate insulating layer surrounding the second region of the fourth semiconductor base material and that functions as a common gate of the second semiconductor base material and the fourth semiconductor base material (seventh invention).

In the seventh invention described above, a length two times a first length that is a thickness of the second gate conductor layer is less than a second length that is a distance between the second gate insulating layer surrounding the first semiconductor base material and the second gate insulating layer surrounding the second semiconductor base material, the first semiconductor base material and the second semiconductor base material facing each other, in the vertical direction relative to the substrate, and is larger than a third length that is a distance between the second gate insulating layer surrounding the first semiconductor base material and the second gate insulating layer surrounding the third semiconductor base material, the first semiconductor base material and the third semiconductor base material facing each other, in the horizontal direction relative to the substrate (eighth invention).

In the seventh invention described above, the first impurity layer, the third impurity layer, the fifth impurity layer, and the seventh impurity layer are connected to a first wiring conductor layer connected to a source line (ninth invention).

In the seventh invention described above, the sixth impurity layer and the eighth impurity layer are connected to a third wiring conductor layer isolated from a second wiring conductor layer (tenth invention).

In the second invention described above, the first wiring conductor layer of a first dynamic flash memory shares the first source line with a second dynamic flash memory adjacent to the first dynamic flash memory (eleventh invention).

In the third invention described above, the second wiring conductor layer of a first dynamic flash memory shares the first bit line with a third dynamic flash memory adjacent to the first dynamic flash memory (twelfth invention).

BRIEF DESCRIPTION OF DRAWINGS

FIGS. 2A, 2B, and 2C are diagrams for explaining a mechanism of an erase operation of the SGT-including memory cell according to the first embodiment.

FIGS. 3A, 3B, and 3C are diagrams for explaining a mechanism of a write operation of the SGT-including memory cell according to the first embodiment.

FIGS. 4AA, 4AB, and 4AC are diagrams for explaining a mechanism of a read operation of the SGT-including memory cell according to the first embodiment.

FIGS. 5A, 5B, and 5C are structural diagrams of an SGT-including memory device according to the first embodiment.

FIGS. 9A and 9B are diagrams for explaining a problem in the operation of the DRAM memory cell including no capacitor in the related art.

DESCRIPTION OF EMBODIMENTS

Hereinafter, the structure and driving system of a semiconductor-element-including memory device (hereinafter called a dynamic flash memory) according to the present invention will be described with reference to the drawings.

First Embodiment

The structure, mechanisms of operations, and manufacturing method of a dynamic flash memory cell according to a first embodiment of the present invention will be described with reference to FIG. 1 to FIGS. 5A to 5C. The structure of the dynamic flash memory cell will be described with reference to FIG. 1. A data erase mechanism will be described with reference to FIGS. 2A to 2C, a data write mechanism will be described with reference to FIGS. 3A to 3C, and a data read mechanism will be described with reference to FIGS. 4AA to 4AC and FIGS. 4BA to 4BC. The manufacturing method for the dynamic flash memory will be described with reference to FIGS. 5A to 5C.

Figure 1:
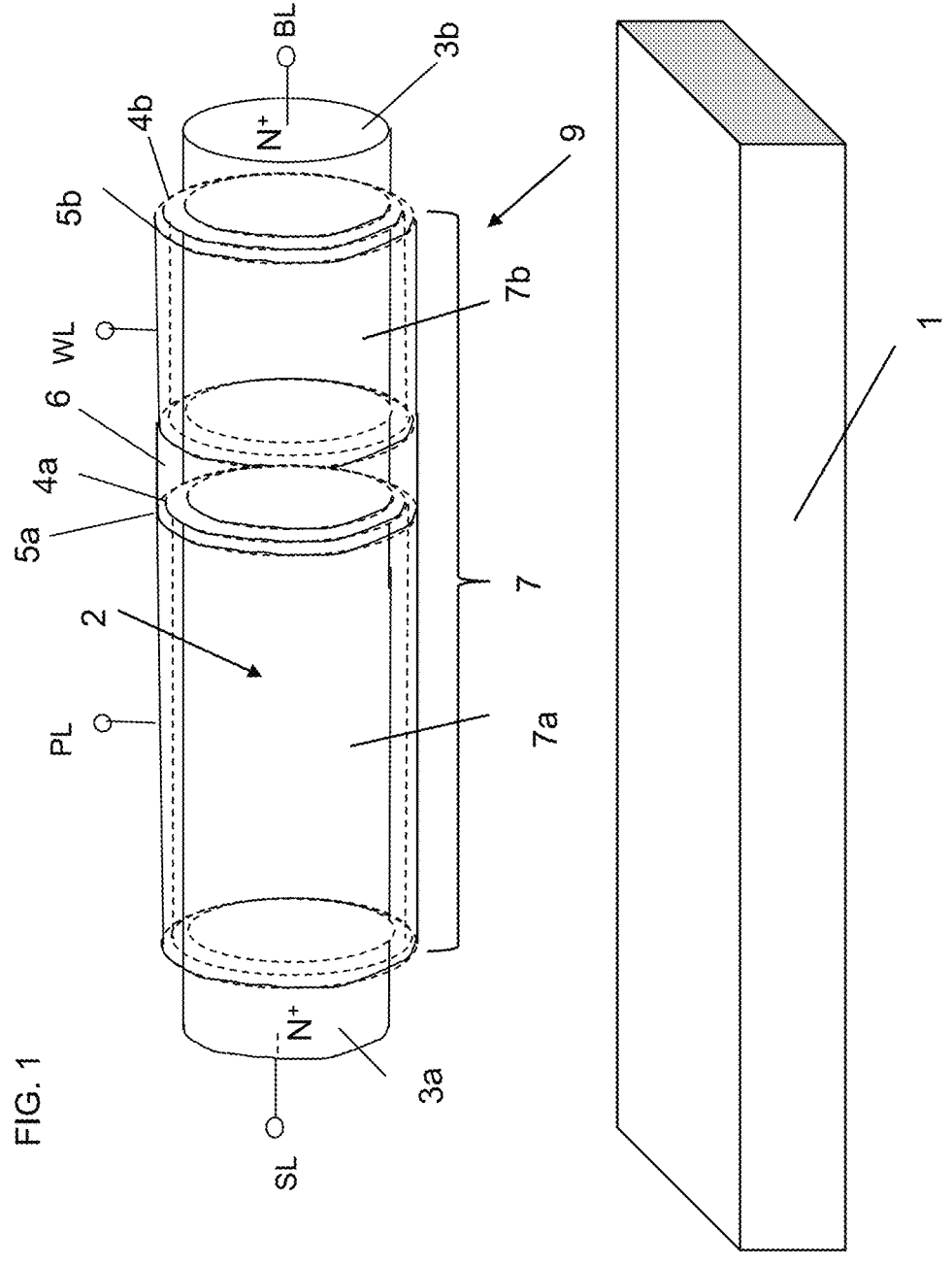
FIG. 1 is a structural diagram of an SGT-including memory cell according to a first embodiment.

FIG. 1 illustrates the structure of the dynamic flash memory cell according to the first embodiment of the present invention. An $N^+$ layer $3a$ (which is an example of "first impurity layer" in the claims) is disposed parallel to a substrate 1 (which is an example of "substrate" in the claims). To the $N^+$ layer $3a$, a silicon semiconductor base material 2 (which is an example of "first semiconductor base material" in the claims) (hereinafter, the silicon semiconductor base material is referred to as "Si base material") is connected. To the Si base material 2, an $N^+$ layer $3b$ (which is an example of "second impurity layer" in the claims) is connected. The Si base material 2 between the $N^+$ layers $3a$ and $3b$ functions as a channel region 7. A first gate insulating layer $4a$ (which is an example of "first gate insulating layer" in the claims) surrounds a first channel region $7a$ that is a portion of the Si base material 2 and that is connected to one end of the Si base material 2. To the first channel region $7a$, a second channel region $7b$ is connected. One end of the second channel region $7b$ is connected to the $N^+$ layer $3b$. A second gate insulating layer $4b$ (which is an example of "second gate insulating layer" in the claims) surrounds the second channel region $7b$. A first gate conductor layer $5a$ (which is an example of "first gate conductor layer" in the claims) surrounds the first gate insulating layer $4a$, and a second gate conductor layer $5b$ (which is an example of "second gate conductor layer" in the claims) surrounds the second gate insulating layer $4b$. The first gate conductor layer $5a$ and the second gate conductor layer $5b$ are isolated from each other by an insulating layer 6. Accordingly, a dynamic flash memory cell 9 constituted by the $N^+$ layers $3a$ and $3b$, the first channel region $7a$, the second channel region $7b$, the first gate insulating layer $4a$, the second gate insulating layer $4b$, the first gate conductor layer $5a$, and the second gate conductor layer $5b$ is formed. The $N^+$ layer $3a$ is connected to a source line SL (which is an example of "source line" in the claims), the $N^+$ layer $3b$ is connected to a bit line BL (which is an example of "first bit line" in the claims), the first gate conductor layer $5a$ is connected to a plate line PL (which is an example of "plate line" in the claims), and the second gate conductor layer $5b$ is connected to a word line WL (which is an example of "word line" in the claims). Desirably, the structure is such that the gate capacitance of the first gate conductor layer $5a$ connected to the plate line PL is larger than the gate capacitance of the second gate conductor layer $5b$ connected to the word line WL. In a memory device, a plurality of dynamic flash memory cells 9 described above are disposed in the vertical direction and in the horizontal direction relative to the substrate 1 to form a dynamic flash memory.

In FIG. 1, to make the gate capacitance of the first gate conductor layer $5a$ connected to the plate line PL larger than the gate capacitance of the second gate conductor layer $5b$ to which the word line WL is connected, the gate length of the first gate conductor layer $5a$ in the horizontal direction is made longer than the gate length of the second gate conductor layer $5b$. Alternatively, instead of making the gate length of the first gate conductor layer $5a$ longer than the gate length of the second gate conductor layer $5b$, the thickness of the gate insulating film of the first gate insulating layer $4a$ may be made thinner than the thickness of the gate insulating film of the second gate insulating layer $4b$. Alternatively, the dielectric constant of the first gate insulating layer $4a$ may be made higher than the dielectric constant of the second gate insulating layer $4b$. The gate capacitance of the first gate conductor layer $5a$ may be made larger than the gate capacitance of the second gate conductor layer $5b$, by a combination of any of the lengths of the gate conductor layers 5a and 5b and the thicknesses and dielectric constants of the gate insulating layers 4a and 4b.

The first gate conductor layer 5a may be divided into two or more gate conductor layers, and the gate conductor layers may each function as a conductive electrode of the plate line and may be operated synchronously or asynchronously. Similarly, the second gate conductor layer 5b may be divided into two or more gate conductor layers, and the gate conductor layers may each function as a conductive electrode of the word line and may be operated synchronously or asynchronously. Also in this case, the operations of the dynamic flash memory can be performed.

Figure 2C:
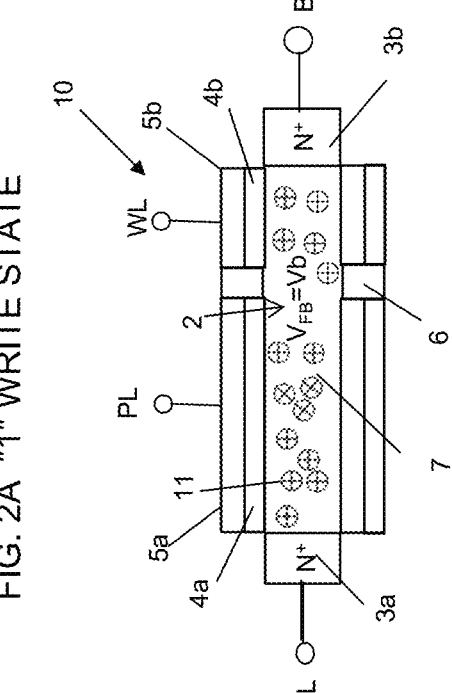

A mechanism of an erase operation of the dynamic flash memory cell according to the first embodiment will be described with reference to FIGS. 2A to 2C. The channel region 7 between the $N^+$ layers 3a and 3b is electrically isolated from the substrate 1 and functions as a floating body. FIG. 2A illustrates a state before the erase operation, in which a group of positive holes 11 generated by impact ionization in the previous cycle are stored in the channel region 7. As illustrated in FIG. 2B, at the time of the erase operation, the voltage of the source line SL is set to a negative voltage VERA. Here, VERA is equal to, for example, −3 V. As a result, regardless of the value of the initial potential of the channel region 7, the PN junction between the $N^+$ layer 3a to which the source line SL is connected and which functions as the source and the channel region 7 is forward biased. As a result, the group of positive holes 11 generated by impact ionization in the previous cycle and stored in the channel region 7 are drawn into the $N^+$ layer 3a that functions as the source, and the potential $V_{FB}$ of the channel region 7 becomes equal to $V_{FB}=V_{ERA}+$ Vb. Here, Vb is the built-in voltage of the PN junction and is equal to about 0.7 V. Therefore, in a case Of $V_{ERA}=-3$ V, the potential of the channel region 7 is equal to −2.3 V. This value indicates the potential state of the channel region 7 in an erase state. Therefore, when the potential of the channel region 7 that is a floating body becomes a negative voltage, the threshold voltage for the N-channel MOS transistor of the dynamic flash memory cell 9 increases due to a substrate bias effect. Accordingly, as illustrated in FIG. 2C, the threshold voltage of the second gate conductor layer 5b to which the word line WL is connected increases. This erase state of the channel region 7 corresponds to logical storage data "0". When the voltage applied to the first gate conductor layer 5a connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased in reading of logical storage data "0" can be attained as illustrated in FIG. 2C. Note that the conditions of voltages applied to the bit line BL, the source line SL, the word line WL, and the plate line PL and the potential of the floating body described above are examples for performing the erase operation, and other operation conditions based on which the erase operation can be performed may be employed. For example, a voltage difference is given between the bit line BL and the source line SL to perform the erase operation.

Figure 3C:
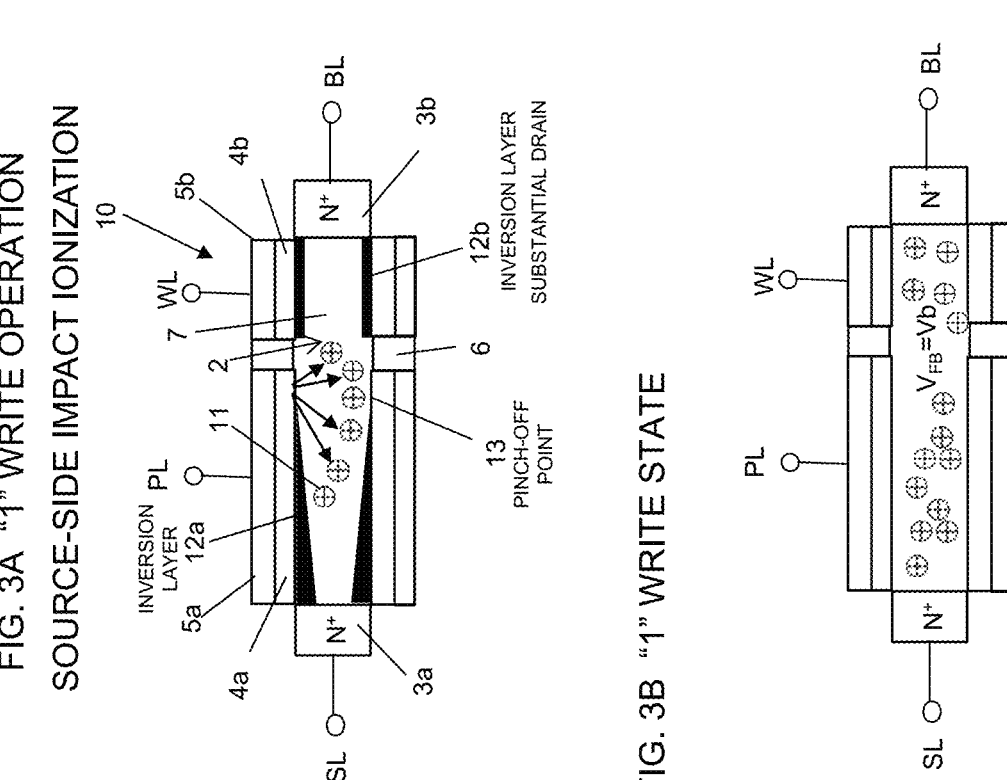

FIGS. 3A to 3C illustrate a write operation of the dynamic flash memory cell according to the first embodiment of the present invention. As illustrated in FIG. 3A, for example, 0 V is applied to the $N^+$ layer 3a to which the source line SL is connected, for example, 3 V is applied to the $N^+$ layer 3b to which the bit line BL is connected, for example, 2 V is applied to the first gate conductor layer 5a to which the plate line PL is connected, and, for example, 5 V is applied to the second gate conductor layer 5b to which the word line WL is connected. As a result, as illustrated in FIG. 3A, an inversion layer 12a is formed in the channel region 7 on the inner side of the first gate conductor layer 5a to which the plate line PL is connected, and a first N-channel MOS transistor region formed of the first channel region 7a (see FIG. 1) surrounded by the first gate conductor layer 5a is operated in the saturation region. As a result, in the inversion layer 12a on the inner side of the first gate conductor layer 5a to which the plate line PL is connected, a pinch-off point 13 is present. In contrast, a second N-channel MOS transistor region formed of the second channel region 7b (see FIG. 1) surrounded by the second gate conductor layer 5b to which the word line WL is connected is operated in the linear region. As a result, an inversion layer 12b in which a pinch-off point is not present is formed on the entire inner side of the second gate conductor layer 5b to which the word line WL is connected. The inversion layer 12b that is formed on the entire inner side of the second gate conductor layer 5b to which the word line WL is connected substantially functions as the drain of the first N-channel MOS transistor region including the first gate conductor layer 5a. As a result, the electric field becomes maximum in a first boundary region of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the $N^+$ layer 3a to which the source line SL is connected toward the $N^+$ layer 3b to which the bit line BL is connected. The accelerated electrons collide with lattice Si atoms, and electron-positive hole pairs are generated by the kinetic energy. Although some of the generated electrons flow into the first gate conductor layer 5a and the second gate conductor layer 5b, most of the generated electrons flow into the $N^+$ layer 3b to which the bit line BL is connected. At the time of "1" writing, electron-positive hole pairs may be generated by using a gate-induced drain leakage (GIDL) current, and the floating body FB may be filled with the generated group of positive holes (see NPL 7).

As illustrated in FIG. 3B, the generated group of positive holes 11 are majority carriers in the channel region 7, with which the channel region 7 is charged to a positive bias. To the $N^+$ layer 3a to which the source line SL is connected, 0 V is applied, and therefore, the channel region 7 is charged up to the built-in voltage Vb (about 0.7 V) of the PN junction between the $N^+$ layer 3a to which the source line SL is connected and the channel region 7. When the channel region 7 is charged to a positive bias, the threshold voltages for the first N-channel MOS transistor region and the second N-channel MOS transistor region decrease due to a substrate bias effect. Accordingly, as illustrated in FIG. 3C, the threshold voltage for the second N-channel MOS transistor region to which the word line WL is connected decreases. This write state of the channel region 7 is assigned to logical storage data "1".

At the time of the write operation, electron-positive hole pairs may be generated by an impact ionization phenomenon or by a GIDL current in a second boundary region between the $N^+$ layer $3a$ and the channel region $7$ or in a third boundary region between the $N^+$ layer $3b$ and the channel region $7$ instead of the first boundary region described above, and the channel region $7$ may be charged with the generated group of positive holes $11$. Note that the conditions of voltages applied to the bit line BL, the source line SL, the word line WL, and the plate line PL described above are examples for performing the write operation, and other operation conditions based on which the write operation can be performed may be employed.

Figure 4B:
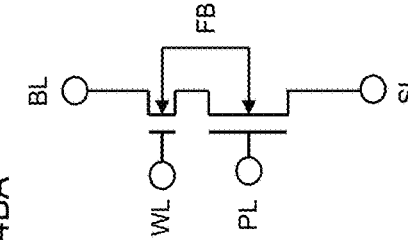
FIGS. 4BA, 4BB, and 4BC are diagrams for explaining the mechanism of the read operation of the SGT-including memory cell according to the first embodiment.
Figure 4B:
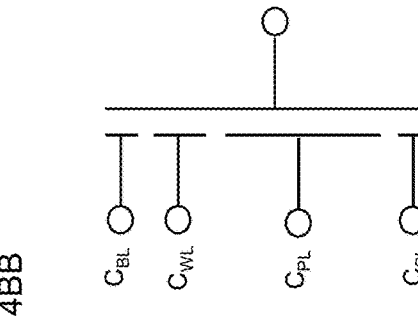
Figure 4B:
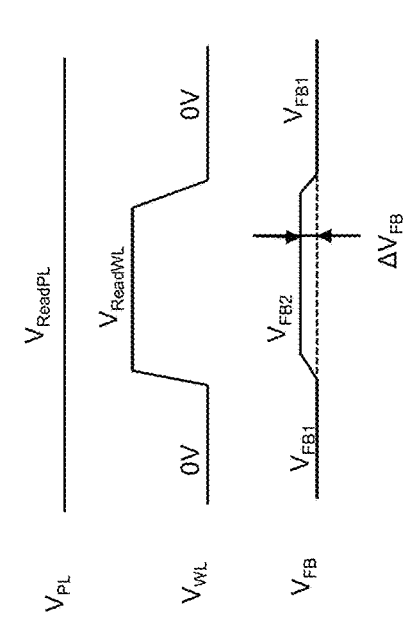

A read operation of the dynamic flash memory cell according to the first embodiment of the present invention will be described with reference to FIGS. 4AA to 4AC and FIGS. 4BA to 4BC. The read operation of the dynamic flash memory cell will be described with reference to FIGS. 4AA to 4AC. As illustrated in FIG. 4AA, when the channel region $7$ is charged up to the built-in voltage Vb (about 0.7 V), the threshold voltage for the N-channel MOS transistor decreases due to a substrate bias effect. This state is assigned to logical storage data "1". As illustrated in FIG. 4AB, in a case where a memory block selected before writing is in an erase state "0" in advance, the floating voltage VFB of the channel region $7$ is equal to $V_{ERA}+Vb$. With a write operation, a write state "1" is stored at random. As a result, logical storage data of logical "0" and that of logical "1" are created for the word line WL. As illustrated in FIG. 4AC, the level difference between the two threshold voltages of the word line WL is used to perform reading by a sense amplifier. When the voltage applied to the first gate conductor layer $5a$ connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased in reading of logical storage data "0" can be attained as illustrated in FIG. 4AC.

The magnitude relationship between the gate capacitance of the first gate conductor layer $5a$ and that of the second gate conductor layer $5b$ at the time of the read operation of the dynamic flash memory cell according to the first embodiment of the present invention and an operation related thereto will be described with reference to FIGS. 4BA to 4BC. It is desirable to design the gate capacitance of the second gate conductor layer $5b$ to which the word line WL is connected so as to be smaller than the gate capacitance of the first gate conductor layer $5a$ to which the plate line PL is connected. FIG. 4BA illustrates an equivalent circuit of one cell of the dynamic flash memory. FIG. 4BB illustrates a coupled capacitance relationship of the dynamic flash memory. Here, $C_{WL}$ denotes the capacitance of the second gate conductor layer $5b$, $C_{PL}$ denotes the capacitance of the first gate conductor layer $5a$, $C_{BL}$ denotes the capacitance of the PN junction between the $N^+$ layer $3b$ that functions as the drain and the channel region $7$, and $C_{SL}$ denotes the capacitance of the PN junction between the $N^+$ layer $3a$ that functions as the source and the channel region $7$. When the voltage of the word line WL changes as illustrated in FIG. 4BC, this operation affects the channel region $7$ as noise. The potential change $\Delta V_{FB}$ of the channel region $7$ at this time is expressed as follows.

$$\Delta V_{FB}=C_{WL}/(C_{PL}+C_{WL}+C_{BL}+C_{SL})\times V_{ReadWL} \quad (1)$$

Here, $V_{ReadWL}$ denotes a changing potential of the word line WL at the time of reading. As apparent from expression (1), when the contribution ratio of Cwm is made smaller relative to the total capacitance $C_{PL}+C_{WL}+C_{BL}+C_{SL}$ of the channel region $7$, $\Delta V_{FB}$ decreases. Note that the conditions of voltages applied to the bit line BL, the source line SL, the word line WL, and the plate line PL and the potential of the floating body described above are examples for performing the read operation, and other operation conditions based on which the read operation can be performed may be employed.

FIGS. 5A to 5C are structural diagrams of the dynamic flash memory according to the first embodiment. Here, the dynamic flash memory cells described with reference to FIG. 1 are formed in two columns in plan view and in four tiers in the vertical direction. FIG. 5A is a plan view of the dynamic flash memory cells when viewed on a horizontal plane along the line A-A' in FIG. 5B. FIG. 5B is a cross-sectional view cut along line X-X' in FIG. 5A. FIG. 5C is a cross-sectional view cut along line Y-Y' in FIG. 5A. The actual dynamic flash memory is formed of a large number of such dynamic flash memory cells disposed in two dimensions and in a large number of tiers.

Figure 6:
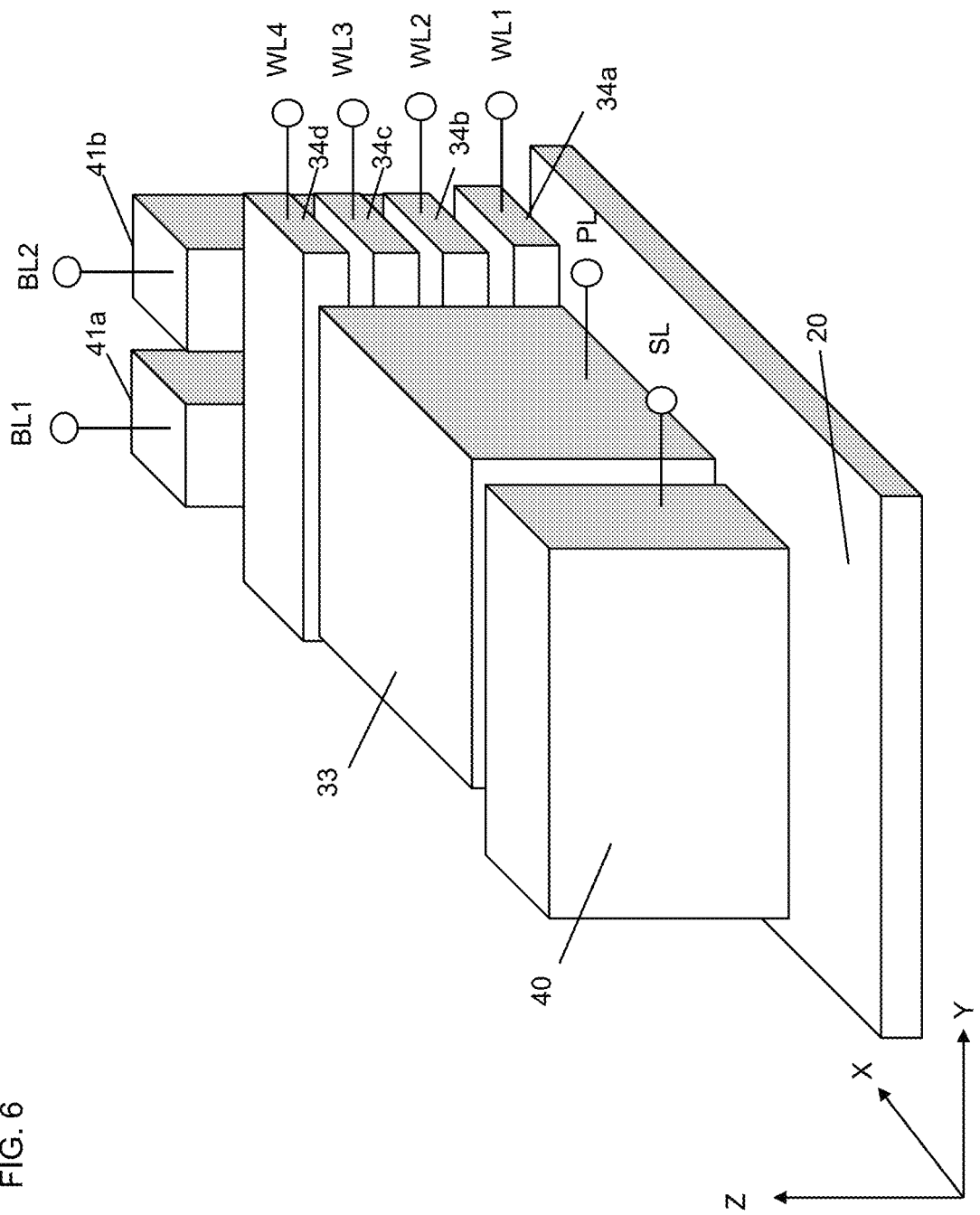
FIG. 6 is a schematic structural diagram of the SGT-including memory device according to the first embodiment.

As illustrated in FIGS. 5A to 5C, on a substrate $20$ (which is an example of "substrate" in the claims) and a $SiO_2$ layer $25$, Si base materials $24aa$, $24ab$, $24ac$ (which is an example of "second semiconductor base material" in the claims), and $24ad$ (which is an example of "first semiconductor base material" in the claims) are formed from the bottom in a first column, and Si base materials $24ba$, $24bb$, $24bc$, and $24bd$ are formed from the bottom in a second column, so as to be isolated from each other in the vertical direction. At the ends, on the X side, of the Si base materials $24aa$, $24ab$, $24ac$, and $24ad$ formed in the first column, $N^+$ layers $30aa$, $30ab$, $30ac$ (which is an example of "third impurity layer" in the claims), and $30ad$ (which is an example of "first impurity layer" in the claims) are formed, respectively. At the other ends, on the X' side, of the Si base materials $24aa$, $24ab$, $24ac$, and $24ad$, $N^+$ layers $30ba$, $30bb$, $30bc$ (which is an example of "fourth impurity layer" in the claims), and $30bd$ (which is an example of "second impurity layer" in the claims) are formed respectively. At the both ends, on the X and X' sides, of the Si base materials $24ba$, $24bb$, $24bc$, and $24bd$ formed in the second column, $N^+$ layers are likewise formed respectively. FIG. 5A shows $N^+$ layers $30cd$ and $30dd$ located at the top of the second column. To support the Si base materials $24aa$ to $24bd$ and the $N^+$ layers $30aa$ to $30dd$, spacer material layers $26a$ and $26b$ are formed. A $HfO_2$ layer $27a$ (which is an example of "first gate insulating layer" in the claims) is formed so that it surrounds each of the one-side portions of the Si base materials $24aa$ to $24bd$, wherein the one-side portions consist of the one-side portions on the X side located adjacent to the $N^+$ layers $30aa$ to $30ad$ connected to the Si base materials $24aa$ to $24ad$ in the first column and the one-side portions on the X side located adjacent to the $N^+$ layers including the $N^+$ layer $30cd$ connected to the Si base materials $24ba$ to $24bd$ in the second column. A $HfO_2$ layer $27b$ (which is an example of "second gate insulating layer" in the claims) is formed so that it is connected to the $HfO_2$ layer $27a$ and surrounds the other-side portions of the Si base materials $24aa$ to $24bd$, wherein the other-side portions consist of the other-side portions on the X' side located adjacent to the $N^+$ layers $30ba$ to $30bd$ in the first column and adjacent to the $N^+$ layers in the second columns. A TiN layer $33$ (which is an example of "first gate conductor layer" in the claims) is formed so that it surrounds the $HfO_2$ layer $27a$ and is formed in contact with the Si base materials $24aa$ to $24ad$ in the first column and the Si base materials $24ba$ to $24bd$ in the second column (FIG. 6). A TiN layer $34a$ (which is an example of "second gate conductor layer" in the claims) is formed so that it surrounds both of the $HfO_2$ layers $27b$ covering the Si base materials 24$aa$ and 24$ba$, respectively. A TiN layer 34$b$ (which is an example of "third gate conductor layer" in the claims) is formed so that it surrounds both of the HfO$_2$ layers 27$b$ covering the Si base materials 24$ab$ and 24$bb$, respectively. A TiN layer 34$c$ is formed so that it surrounds both of the HfO$_2$ layers 27$b$ covering the Si base materials 24$ac$ and 24$bc$, respectively. A TiN layer 34$d$ is formed so that it surrounds both of the HfO$_2$ layers 27$b$ covering the Si base materials 24$ad$ and 24$bd$, respectively. A metal electrode layer 40 is formed so that it is connected to the N$^+$ layers 30$aa$ to 30$ad$ of the Si base materials 24$aa$ to 24$ad$ in the first column and to the N$^+$ layers including to the N$^+$ layer 30$cd$ of the Si base materials 24$ba$ to 24$bd$ in the second column. A metal electrode layer 41$a$ is formed on the X' side that is connected to the N$^+$ layers 30$ba$ to 30$bd$ in the first column. A metal electrode layer 41$b$ is formed on the X' side that is connected to the N$^+$ layers including the N$^+$ layer 30$dd$ in the second column. A SiO$_2$ layer 37$a$ is formed on the X side that surrounds the N$^+$ layers 30$aa$ to 30$ad$ in the first column and the N$^+$ layers including the N$^+$ layer 30$dd$ in the second column. A SiO$_2$ layer 37$b$ is forced on the X' side that surrounds the N$^+$ layers 30$ba$ to 30$bd$ in the first column the N$^+$ layers including the N$^+$ layer 30$dd$ in the second column. A SiO$_2$ layer 38 is formed so as to cover the entire silicon base materials in both the first and second columns. A SiO$_2$ layer 31 is formed between two adjacent of the TiN layers 34$a$ to 34$d$ in the vertical direction.

In FIGS. 5A to 5C, the metal electrode layer 40 is connected to a source line SL. The TiN layer 33 is connected to a plate line PL. The TiN layer 34$a$ is connected to a first word line WL1, the TiN layer 34$b$ is connected to a second word line WL2, the TiN layer 34$c$ is connected to a third word line WL3, and the TiN layer 34$d$ is connected to a fourth word line WL4. The metal electrode layer 41$a$ is connected to a first bit line BL1, and the metal electrode layer 41$b$ is connected to a second bit line BL2. Accordingly, the dynamic flash memory constituted by memory cells in two columns in plan view and in four tiers in the vertical direction is formed on the substrate 20.

In FIGS. 5A to 5C, a HfO$_2$ layer (not illustrated) that entirely surrounds the Si base materials 24$aa$ to 24$bd$ is formed. A TiN layer (not illustrated) that surrounds this HfO$_2$ layer and that has a uniform thickness is formed with, for example, the ALD (Atomic Layer Deposition) method. Portions of the HfO$_2$ layer and the TiN layer near the metal electrodes are removed by etching to thereby form the HfO$_2$ layer 27$b$ and the TiN layers 34$a$ to 34$d$. As illustrated in FIG. 5C, when the distance L2 between the HfO$_2$ layers 27$b$ that are between and surround corresponding ones of the Si base materials 24$aa$ to 24$bd$ is made larger than two times the thickness L1 of the TiN layers 34$a$ to 34$d$ in the vertical direction relative to the substrate 20, the TiN layers 34$a$ to 34$d$ can be formed so as to be spaced apart from each other in the vertical direction relative to the substrate 20. When the distance L3 between the HfO$_2$ layers 27$b$ that are between and surround corresponding ones of the Si base materials 24$aa$ to 24$bd$ is made less than two times the thickness L1 of the TiN layers 34$a$ to 34$d$ in the horizontal direction relative to the substrate 20, each of the TiN layers 34$a$ to 34$d$ can be formed of portions contiguous in the horizontal direction relative to the substrate 20.

FIG. 6 schematically illustrates the external appearance of the memory device illustrated in FIGS. 5A to 5C. In the coordinate system illustrated in FIG. 6, the X-axis direction corresponds to the X-X' direction in FIGS. 5A and 5B, the Y-axis direction corresponds to the Y-Y' direction in FIGS. 5A and 5C, and the Z-axis direction corresponds to the direction perpendicular to the substrate 20. Although not visible in FIG. 6, the Si base materials 24$aa$, 24$ab$, 24$ac$, and 24$ad$ in the first column, and the Si base materials 24$ba$, 24$bb$, 24$bc$, and 24$bd$ in the second column illustrated in FIGS. 5A to 5C are located inside the TiN layer 33 and each located in a corresponding one of the TiN layers 34$a$ to 34$d$ and extend in the X-axis direction. The metal electrode layer 40 connected to the N$^+$ layers 30$aa$, 30$ab$, 30$ac$, and 30$ad$ in the first column, and the N$^+$ layers including the N$^+$ layer 30$cd$ in the second column illustrated in FIGS. 5A to 5C are connected to the source line SL. The TiN layer 33 that surrounds the Si base materials 24$aa$, 24$ab$, 24$ac$, 24$ad$, 24$ba$, 24$bb$, 24$bc$, and 24$bd$ illustrated in FIGS. 5A to 5C and is connected to the plate line PL. The TiN layer 34$a$ that surrounds the Si base materials 24$aa$ and 24$ba$ is connected to the first word line WL1, and the TiN layer 34$b$ that surrounds the Si base materials 24$ab$ and 24$bb$ is connected to the second word line WL2. The TiN layer 34$c$ that surrounds the Si base materials 24$ac$ and 24$bc$ is connected to the third word line WL3. The TiN layer 34$d$ that surrounds the Si base materials 24$ad$ and 24$bd$ is connected to the fourth word line WL4. The metal electrode layer 41$a$ connected to the N$^+$ layers 30$ba$ to 30$bd$ in the first column shown in FIGS. 5A to 5C is connected to the first bit line BL1. The metal electrode layer 41$b$ connected to the N$^+$ layers including the N+ layer 30$dd$ in the second column is connected to the second bit line BL2. As illustrated in FIG. 6, the TiN layers 34$a$ to 34$d$ respectively connected to the word lines WL1 to WL4 are parallel to the substrate 20. The metal electrode layers 41$a$ and 41$b$ respectively connected to the bit lines BL1 and BL2 are formed so as to extend in the vertical direction relative to the substrate 20. When viewed on the Z-Y plane, the TiN layers 34$a$ to 34$d$ are orthogonal to the metal electrode layers 41$a$ and 41$b$.

On the substrate 20, two two-column four-tier dynamic flash memories illustrated in FIG. 6 can be disposed in the X direction so as to share the metal electrode layer 40 connected to the source line SL of both memories. In this case, in plan view (X-Y plane), the source line SL is disposed in the center, and the bit lines BL1 and BL2 are disposed on both sides. Accordingly, a highly integrated dynamic flash memory can be attained.

Further, two two-column four-tier dynamic flash memories illustrated in FIG. 6 can be disposed in the X direction so as to share the metal electrode layers 41$a$ and 41$b$ respectively connected to the bit lines BL1 and BL2 of both memories. In this case, in plan view (X-Y plane), the bit lines BL1 and BL2 are disposed in the center, and the source line SL is disposed on both sides. Accordingly, although four word lines WL1 to WL4 are connected to each of the bit lines BL1 and BL2 in FIG. 6, the number of the connected word lines WL can be increased to eight with this disposition. In addition, a highly integrated dynamic flash memory can be attained. Note that high integration can be similarly attained by connecting two or more dynamic flash memories.

Figure 7:
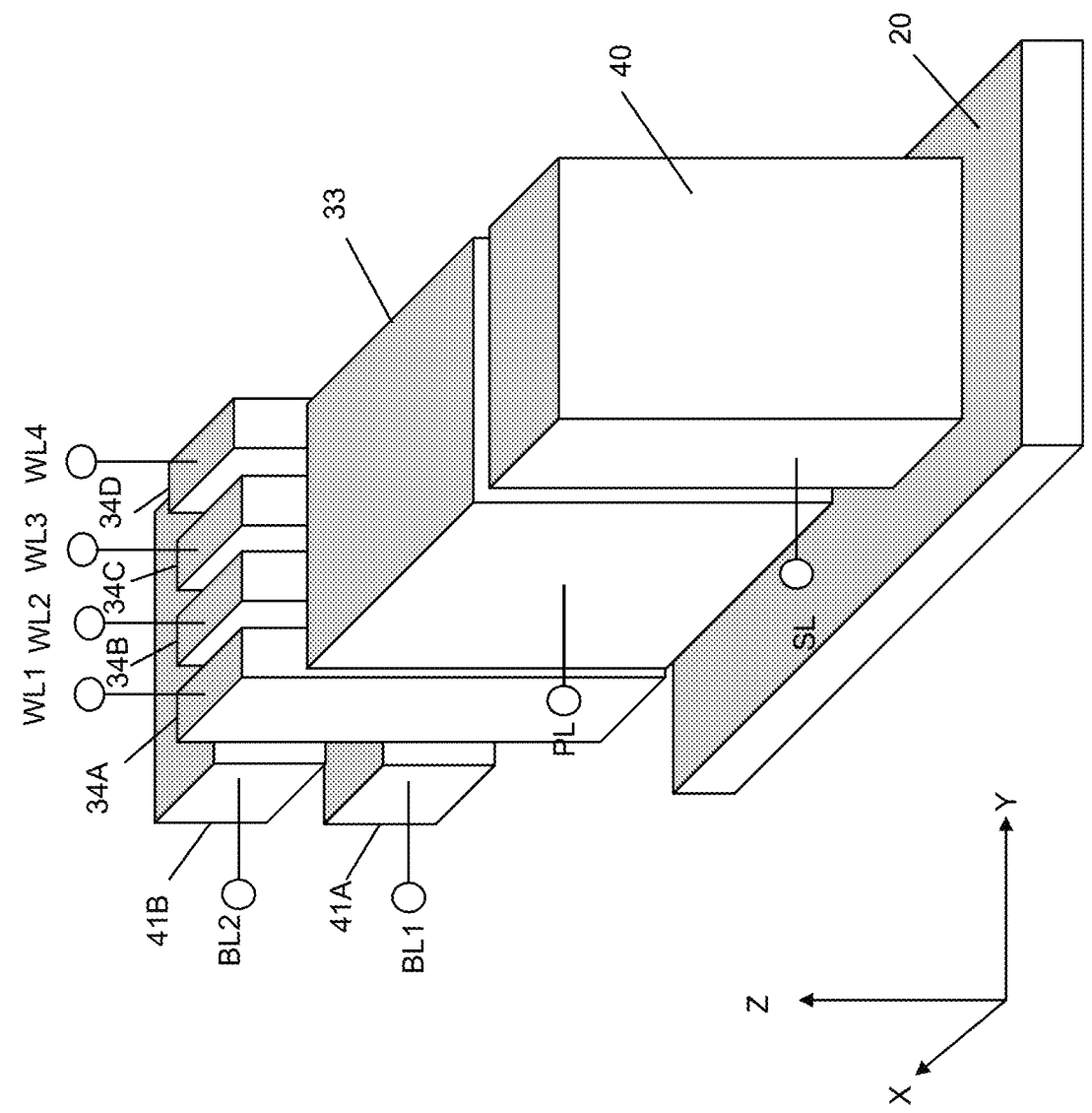
FIG. 7 is a schematic structural diagram of the SGT-including memory device according to a second embodiment.
Figure 8A:
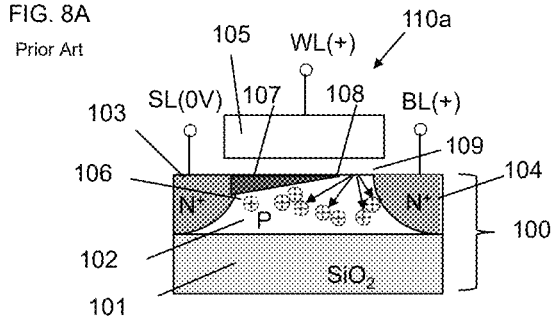
FIGS. 8A, 8B, 8C, and 8D are diagrams illustrating a write operation of a DRAM memory cell including no capacitor in the related art.
Figure 8B:
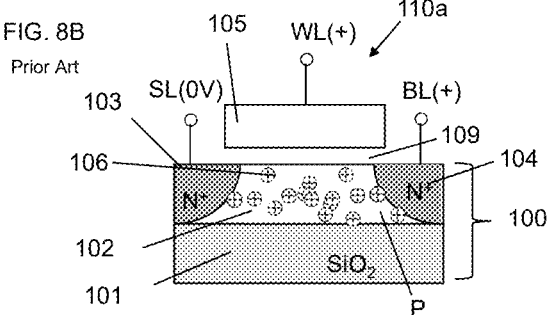
Figure 8C:
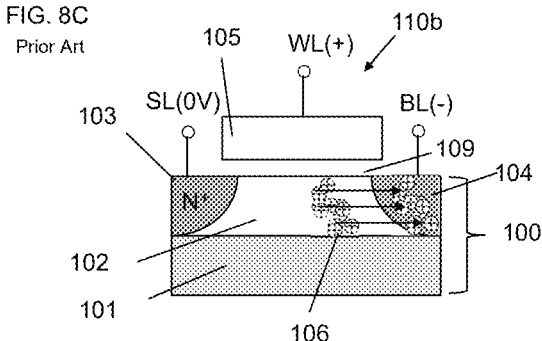
Figure 8D:
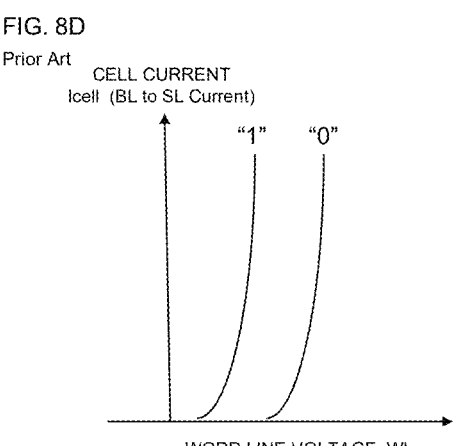
Figures 10A, 10B, 10C:
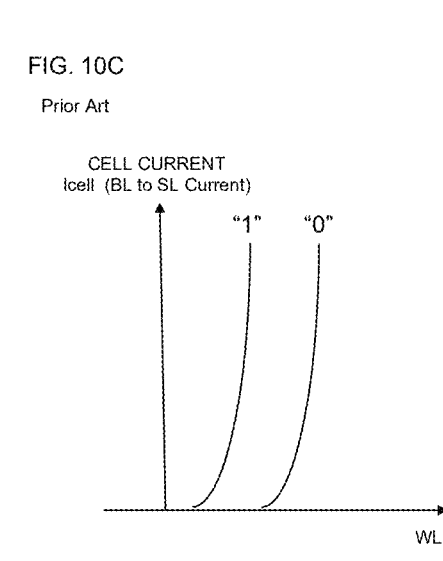
FIGS. 10A, 10B, and 10C are diagrams illustrating a read operation of the DRAM memory cell including no capacitor in the related art.

As illustrated in FIG. 7, the TiN layers 34$a$ to 34$d$ respectively connected to the word lines WL1 to WL4 in FIG. 6 are rotated 90 degrees to form TiN layers 34A, 34B, 34C, and 34D that extend in the Z direction. The metal electrode layers 41$a$ and 41$b$ respectively connected to the bit lines BL1 and BL2 in FIG. 6 are rotated 90 degrees to form metal electrode layers 41A and 41B that extend in the Y direction. Accordingly, a dynamic flash memory having four columns and two tiers can be formed similarly to FIG. 6. When a plurality of dynamic flash memories are connected with a method the same as in FIG. 6, the number of the word lines WL connected to one bit line BL can be increased. As in FIG. 6, when the source line SL or the bit lines BL are shared between adjacent dynamic flash memories, high integration can be attained.

Although the first channel region 7a and the second channel region 7b having rectangular vertical cross sections have been described with reference to FIG. 1, these vertical cross sections may have trapezoidal shapes. The first channel region 7a and the second channel region 7b may have vertical cross sections of different shapes, namely, a rectangular shape and a trapezoidal shape.

Even when the first gate conductor layer 5a partially surrounds the first gate insulating layer 4a in FIG. 1, the operations of the dynamic flash memory can be performed. Even when the first gate conductor layer 5a is divided into a plurality of conductor layers and the conductor layers are driven synchronously or asynchronously, the operations of the dynamic flash memory can be performed. Similarly, even when the second gate conductor layer 5b is divided into a plurality of conductor layers and the conductor layers are driven synchronously or asynchronously, the operations of the dynamic flash memory can be performed.

In FIG. 1, the first gate conductor layer 5a may be connected to the word line WL, and the second gate conductor layer 5b may be connected to the plate line PL. Also in this case, the operations of the dynamic flash memory described above can be performed.

Even with a structure in which the conductivity type of each of the N$^+$ layers 3a and 3b and the P-layer Si base material 2 is reversed, the operations of the dynamic flash memory can be performed. In this case, in the Si base material 2 that is of N-type, the majority carriers are electrons. Therefore, a group of electrons generated by impact ionization are stored in the channel region 7, and a "1" state is set.

The first channel region 7a and the second channel region 7b may have different impurity concentrations. Further, the first channel region 7a and the second channel region 7b may be made of different semiconductor materials.

In FIGS. 5A to 5C, the TiN layer 33 that surrounds the Si base materials 24aa to 24ad and 24ba to 24bd, that is connected to the plate line PL, and that is formed of contiguous portions is formed. In I contrast, TiN layers that surround the Si base materials 24aa to 24ad and 24ba to 24bd and that are connected to the plate lines PL isolated from each other may be formed.

This embodiment has the following features.
(Feature 1)

Regarding the plate line PL of the dynamic flash memory cell according to the embodiment of the present invention, in the write operation and in the read operation performed by the dynamic flash memory cell, the voltage of the word line WL changes. At this time, the plate line PL assumes the role of decreasing the capacitive coupling ratio between the word line WL and the channel region 7. As a result, an effect on changes in the voltage of the channel region 7 when the voltage of the word line WL changes can be substantially suppressed. Accordingly, the difference between the threshold voltages indicating logical "0" and logical "1" can be increased. This leads to an increased operation margin of the dynamic flash memory cell.
(Feature 2)

As described with reference to FIGS. 5A to 5C, when the distance L2 between the HfO$_2$ layers 27b that are between and surround corresponding ones of the Si base materials 24aa to 24bd is made larger than two times the thickness L1 of the TiN layers 34a to 34d in the vertical direction relative to the substrate 20, the TiN layers 34a to 34d can be formed so as to be spaced apart from each other in the vertical direction relative to the substrate 20. When the distance L3 between the HfO$_2$ layers 27b that are between and surround corresponding ones of the Si base materials 24aa to 24bd is made less than two times the thickness L1 of the TiN layers 34a to 34d in the horizontal direction relative to the substrate 20, each of the TiN layers 34a to 34d can be formed of portions contiguous in the horizontal direction relative to the substrate 20. When the TiN layers 34a to 34d are formed with the ALD method that enables deposition with a uniform thickness, the TiN layers 34a to 34d that are each formed of contiguous portions and that extend in the horizontal direction, and that are respectively connected to the word lines WL1 to WL4 isolated from each other in the vertical direction can be easily formed. Accordingly, a simplified manufacturing method can be attained.
(Feature 3)

As described above with reference to FIG. 6, when the source line SL is shared between dynamic flash memories adjacent to each other, a highly integrated dynamic flash memory can be attained.
(Feature 4)

As described above with reference to FIG. 6, when the bit lines BL are shared between dynamic flash memories adjacent to each other, the number of the word lines WL connected to each bit line BL can be increased, and a highly integrated dynamic flash memory can be attained.

OTHER EMBODIMENTS

In the first embodiment, the gate conductor layer 5a connected to the plate line PL may be formed of a single layer or a combination of a plurality of conductor material layers. Similarly, the gate conductor layer 5b connected to the word line WL may be formed of a single layer or a combination of a plurality of conductor material layers. The outside of the gate conductor layers may be connected to a wiring metal layer made of, for example, W. The same applies to other embodiments according to the present invention.

Note that in FIG. 1, the length of the first gate conductor layer 5a, in the horizontal direction, to which the plate line PL is connected is made further longer than the length of the second gate conductor layer 5b, in the horizontal direction, to which the word line WL is connected to attain $C_{PL} > C_{WL}$. However, when only the plate line PL is added, the capacitive coupling ratio ($C_{WL}/(C_{PL}+C_{WL}+C_{BL}+C_{SL})$) of the word line WL to the channel region 7 decreases. As a result, the potential change $\Delta V_{FB}$ of the floating body, namely, the channel region 7, decreases.

As the voltage of the plate line PL described in the first embodiment, a fixed voltage of, for example, 2 V may be applied regardless of the operation mode. As the voltage of the plate line PL, for example, 0 V may be applied only at the time of erasing. As the voltage of the plate line PL, a fixed voltage or a voltage changing over time may be applied as long as the voltage satisfies the conditions based on which the operations of the dynamic flash memory can be performed.

Although the vertical cross sections of the first channel region 7a and the second channel region 7b have round shapes in the first embodiment, the vertical cross sections of the first channel region 7a and the second channel region 7b may have rectangular shapes as illustrated in FIGS. 5A to 5C, elliptic shapes, or shapes elongated in one direction instead of round shapes. Also, in a logic circuit region formed apart from the dynamic flash memory cell region, Si base materials having different shapes may coexist and be formed in the logic circuit region in accordance with the logic circuit design. The same applies to other embodiments according to the present invention.

Although a negative bias is applied to the source line SL at the time of the erase operation to discharge the group of positive holes in the channel region 7 that is the floating body FB as described in the first embodiment, instead of applying a negative bias to the source line SL, a negative bias may be applied to the bit line BL or a negative bias may be applied to the source line SL and to the bit line BL to perform the erase operation. The erase operation may be performed on the basis of other voltage conditions. The same applies to other embodiments according to the present invention.

In FIG. 1, an N-type or P-type impurity layer may be disposed between the $N^+$ layer 3a and the first channel region 7a. Further, an N-type or P-type impurity layer may be disposed between the $N^+$ layer 3b and the second channel region 7b. The same applies to other embodiments according to the present invention.

In FIG. 1, the first channel region 7a and the second channel region 7b may have different acceptor impurity concentrations. The same applies to other embodiments according to the present invention.

The $N^+$ layers 3a and 3b in the first embodiment may be formed of other semiconductor material layers containing a donor impurity. The $N^+$ layer 3a and the $N^+$ layer 3b may be formed of different semiconductor material layers. The same applies to other embodiments according to the present invention.

The boundary between the first channel region 7a and the second channel region 7b in the horizontal direction in FIG. 1 may be at the position of the insulating layer 6 or may be at a position adjacent to the first channel region 7a or adjacent to the second channel region 7b. The same applies to other embodiments according to the present invention.

It has been described with reference to FIG. 1 that the first gate conductor layer 5a may be connected to the word line WL and the second gate conductor layer 5b may be connected to the plate line PL. The same applies to other embodiments according to the present invention.

In FIGS. 5A to 5C, the TiN layer 33 connected to the plate line PL is formed of portions that are contiguous across the Si base materials 24aa, 24ab, 24ac, 24ad, 24ba, 24bb, 24bc, and 24bd. In contrast, the TiN layer 33 may be formed of portions that are isolated from each other similarly to the TiN layers 34a to 34d connected to the word lines WL. The same applies to other embodiments according to the present invention.

Although FIG. 6 and FIG. 7 illustrate the source line SL and the plate line PL that are led out in the horizontal direction, the source line SL and the plate line PL may be led out in the vertical direction. The same applies to other embodiments according to the present invention.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

INDUSTRIAL APPLICABILITY

With the semiconductor-element-including memory device according to the present invention, a high-density and high-performance dynamic flash memory can be obtained.

The invention claimed is:

1. A semiconductor memory device comprising:
a first semiconductor base material that extends parallel to and in a horizontal direction relative to a substrate, wherein the first semiconductor base material is formed to have a length measured from a first end of the first semiconductor base material through a second end of the first semiconductor base material and formed to have one type of carriers charged throughout the length of the first semiconductor base material;
a second semiconductor base material that is apart from the first semiconductor base material in a vertical direction and that overlaps the first semiconductor base material in plan view, wherein the second semiconductor base material is formed to have a length measured from a first end of the second semiconductor base material through a second end of the second semiconductor base material and formed to have said one type of carriers charged throughout the length of the second semiconductor base material;
a first impurity layer that has a conductivity type and is connected to the first end of the first semiconductor base material and a second impurity layer that has said conductivity type and is connected to the second end of the first semiconductor base material;
a third impurity layer that has said conductivity type and is connected to the first end of the second semiconductor base material and a fourth impurity layer that has said conductivity type and is connected to the second end of the second semiconductor base material;
a first gate insulating layer that covers a first region of the first semiconductor base material connected to the first impurity layer and a first region of the second semiconductor base material connected to the third impurity layer;
a second gate insulating layer that is connected to the first gate insulating layer and that covers a second region of the first semiconductor base material and a second region of the second semiconductor base material;
a first gate conductor layer that covers the first gate insulating layer and that functions as a common gate of the first semiconductor base material and the second semiconductor base material;
a second gate conductor layer that surrounds the second gate insulating layer surrounding the second region of the first semiconductor base material; and
a third gate conductor layer that surrounds the second gate insulating layer surrounding the second region of the second semiconductor base material and that is electrically apart from the second gate conductor layer, wherein
voltages applied to the first impurity layer, the second impurity layer, the third impurity layer, the fourth impurity layer, the first gate conductor layer, the second gate conductor layer, and the third gate conductor layer are controlled to perform a memory write operation, a memory read operation, and a memory erase operation.

2. The semiconductor memory device according to claim 1, wherein the second impurity layer and the fourth impurity layer are connected to a first bit line, and the second gate conductor layer and the third gate conductor layer are isolated from each other.

3. The semiconductor memory device according to claim 1, wherein the second gate conductor layer and the third gate conductor layer are connected to each other, and the second impurity layer and the fourth impurity layer are connected to a first bit line.

4. The semiconductor memory device according to claim 1, wherein the second and third gate conductor layers are connected to word lines, and the first gate conductor layer is connected to a plate line.

5. The semiconductor memory device according to claim 1, wherein a first dynamic flash memory is constituted by and comprises:

a third semiconductor base material that is at a height the same as a height at which the first semiconductor base material is disposed in the vertical direction and that extends parallel to the first semiconductor base material;

a fourth semiconductor base material that is disposed as high as the second semiconductor base material is disposed in the vertical direction and that extends parallel to the second semiconductor base material;

a fifth impurity layer that is connected to one end of the third semiconductor base material and a sixth impurity layer that is connected to the other end of the third semiconductor base material;

a seventh impurity layer that is connected to one end of the fourth semiconductor base material and an eighth impurity layer that is connected to the other end of the fourth semiconductor base material;

the first gate insulating layer that covers a first region of the third semiconductor base material connected to the fifth impurity layer and a first region of the fourth semiconductor base material connected to the seventh impurity layer;

the second gate insulating layer that is connected to the first gate insulating layer and that covers a second region of the third semiconductor base material and a second region of the fourth semiconductor base material;

the first gate conductor layer that surrounds the first gate insulating layer and that functions as a common gate of the first semiconductor base material, the second semiconductor base material, the third semiconductor base material, and the fourth semiconductor base material;

the second gate conductor layer that surrounds the second gate insulating layer surrounding the second region of the third semiconductor base material and that functions as a common gate of the first semiconductor base material and the third semiconductor base material; and the third gate conductor layer that surrounds the second gate insulating layer surrounding the second region of the fourth semiconductor base material and that functions as a common gate of the second semiconductor base material and the fourth semiconductor base material.

6. The semiconductor memory device according to claim 5, wherein viewed vertically relative to the substrate, a length that is two times as long as a first length that is equal to a thickness of the second gate conductor layer is less than a second length that is equal to a distance between the second gate insulating layer surrounding the first semiconductor base material and the second gate insulating layer surrounding the second semiconductor base material facing the first semiconductor base material, and, viewed horizontally relative to the substrate, is larger than a third length that is equal to a distance between the second gate insulating layer surrounding the first semiconductor base material and the second gate insulating layer surrounding the third semiconductor base material facing the first semiconductor base material.

7. The semiconductor memory device according to claim 5, wherein the first impurity layer, the third impurity layer, the fifth impurity layer, and the seventh impurity layer are connected to a first wiring conductor layer connected to a source line.

8. The semiconductor memory device according to claim 5, wherein the sixth impurity layer and the eighth impurity layer are connected to a third wiring conductor layer isolated from a second wiring conductor layer.

9. The semiconductor memory device according to claim 1, wherein a first wiring conductor layer of a first dynamic flash memory shares a first source line with a second dynamic flash memory adjacent to the first dynamic flash memory.

10. The semiconductor memory device according to claim 2, wherein the second wiring conductor layer of a first dynamic flash memory shares the first bit line with a third dynamic flash memory adjacent to the first dynamic flash memory.

11. A semiconductor memory array including a plurality of memory cells arranged in a matrix, each memory cell comprising:

a semiconductor base material formed in a columnar shape to have a longitudinal length, wherein the semiconductor base material includes first and second regions arranged in series in the longitudinal length of the semiconductor base material, wherein the semiconductor base material is formed to have one type of carriers charged throughout the longitudinal length of the semiconductor base material;

a first impurity layer having a conductivity type and connected to one end of the semiconductor base material adjacent to the first region, and a second impurity layer having said conductivity type and connected to the other end of the semiconductor base material adjacent to the second region;

a first gate insulating layer formed to circumferentially surround the first region of the semiconductor base material;

a second gate insulating layer connected in series in the longitudinal direction to the first gate insulating layer, the second gate insulating layer being formed to circumferentially surround the second region of the semiconductor base material;

a first gate conductor layer formed to circumferentially surround the first gate insulating layer; and a second gate conductor layer formed to circumferentially surround the second gate insulating layer, the first and second gate conductor layers being arranged in series in the longitudinal direction and separated from each other with no terminal line provided therebetween, wherein the semiconductor memory array comprises eight (8) memory cells arranged in a matrix of four rows and two columns, the four rows including first, second, third and fourth rows arranged in a column direction in an ordinal sequence, and the two columns including first and second columns arranged in a row direction, wherein:

the eight (8) memory cells include eight (8) first impurity layers all connected to a single source line;

the eight (8) memory cells include eight (8) second impurity layers that include a set of four (4) second impurity layers arranged along the first column and all connected to a single first bit line and another set of four (4) second impurity layers arranged along the second column and all connected to a single second bit line;

the eight (8) memory cells include eight (8) first gate conductor layers all connected to a single plate line; and the eight (8) memory cells include eight (8) second gate conductor layers that include four (4) pairs of second gate conductor layers, each pair includes two adjacent second gate conductor layers arranged in a row with an identical ordinal number and connected to each other.

\* \* \* \* \*